US009263602B2

(12) United States Patent
Harley et al.

(10) Patent No.: US 9,263,602 B2
(45) Date of Patent: Feb. 16, 2016

(54) LASER PROCESSING OF SOLAR CELLS WITH ANTI-REFLECTIVE COATING

(71) Applicant: SUNPOWER CORPORATION, San Jose, CA (US)

(72) Inventors: Gabriel Harley, Mountain View, CA (US); David D. Smith, Campbell, CA (US); Tim Dennis, Canton, TX (US); Ann Waldhauer, La Honda, CA (US); Taeseok Kim, San Jose, CA (US); Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/061,584

(22) Filed: Oct. 23, 2013

(65) Prior Publication Data

US 2014/0096824 A1 Apr. 10, 2014

Related U.S. Application Data

(63) Continuation of application No. 13/028,059, filed on Feb. 15, 2011, now Pat. No. 8,586,403.

(51) Int. Cl.
*H01L 21/00* (2006.01)
*H01L 31/0224* (2006.01)
*H01L 31/068* (2012.01)
*H01L 31/18* (2006.01)
*H01L 31/0216* (2014.01)

(52) U.S. Cl.
CPC .. *H01L 31/022441* (2013.01); *H01L 31/02168* (2013.01); *H01L 31/0682* (2013.01); *H01L 31/1804* (2013.01); *Y02E 10/52* (2013.01); *Y02E 10/547* (2013.01)

(58) Field of Classification Search
CPC ............. H01L 31/02168; H01L 31/022441; H01L 31/0682; H01L 31/1804; Y02E 10/52; Y02E 10/547
USPC ................... 136/256; 438/98, 72, 96
See application file for complete search history.

(56) References Cited

U.S. PATENT DOCUMENTS

| 4,322,571 A | 3/1982 | Stanbery | |
|---|---|---|---|
| 4,927,770 A * | 5/1990 | Swanson | ............... 438/83 |

(Continued)

FOREIGN PATENT DOCUMENTS

| CN | 101124681 A | 2/2008 |
|---|---|---|
| JP | 2007134655 A | 5/2007 |

(Continued)

OTHER PUBLICATIONS

C. Reichel, et al. "Decoupling Charge Carrier Collection and Metallization Geometry of Back-Contacted Back-Junction Silicon Solar Cells by Using Insulating Thin Films", Jun. 20-25, 2010, pp. 1034-1038, 35th IEEE Photovoltaic Specialists Conferences (PVSC), Honolulu, HI.

(Continued)

*Primary Examiner* — Duy T Nguyen
(74) *Attorney, Agent, or Firm* — Okamoto & Benedicto LLP

(57) ABSTRACT

Contact holes of solar cells are formed by laser ablation to accommodate various solar cell designs. Use of a laser to form the contact holes is facilitated by replacing films formed on the diffusion regions with a film that has substantially uniform thickness. Contact holes may be formed to deep diffusion regions to increase the laser ablation process margins. The laser configuration may be tailored to form contact holes through dielectric films of varying thicknesses.

7 Claims, 10 Drawing Sheets

(56) References Cited

U.S. PATENT DOCUMENTS

| | | | |
|---|---|---|---|
| 5,432,015 A | 7/1995 | Wu et al. | |
| 5,821,590 A | 10/1998 | Lee et al. | |
| 2006/0060238 A1 | 3/2006 | Hacke et al. | |
| 2006/0196535 A1 | 9/2006 | Swanson et al. | |
| 2008/0299279 A1 | 12/2008 | Brewer et al. | |
| 2008/0299297 A1 | 12/2008 | Cousins et al. | |
| 2009/0151784 A1 | 6/2009 | Luan et al. | |
| 2009/0239331 A1* | 9/2009 | Xu et al. | 438/98 |
| 2009/0308457 A1* | 12/2009 | Smith | 136/261 |
| 2011/0136286 A1* | 6/2011 | Stewart et al. | 438/57 |
| 2011/0300665 A1* | 12/2011 | Harley et al. | 438/96 |

FOREIGN PATENT DOCUMENTS

| | | |
|---|---|---|
| JP | 2007194636 A | 8/2007 |
| JP | 2008512858 A | 4/2008 |
| WO | WO2005/076959 A2 | 8/2005 |

OTHER PUBLICATIONS

C. Allebe, et al. "Process Integration Towards Perl Structure", Sep. 6-10, 2010, pp. 1469-1474, 25th European Photovoltaic Solar Energy Conference and Exhibition / 5th World Conference on Photovoltaic Energy Conversion, Valencia, Spain.

F. Granek "High-Efficiency Back-Contact Back-Junction Silicon Solar Cells", Jul. 2009, pp. 1-209, Dissertation Thesis, Albert-Ludwigs-University Freiburg im Breisgau.

J.L. Hernandez, et al. "Laser Ablation and Contact Formation for Cu-Plated Large Area C-Silicon Industrial Solar Cells", Jun. 20-25, 2010, pp. 3158-3162, 35th IEEE Photovoltaic Specialists Conferences (PVSC), Honolulu, HI.

Written Opinion of the Intellectual Property Office of Singapore for Application No. 201306158-5, Jul. 4, 2014, 5 sheets.

* cited by examiner

LASER PROCESSING OF SOLAR CELLS WITH ANTI-REFLECTIVE COATING

CROSS-REFERENCE TO RELATED APPLICATION

This application is a continuation of U.S. patent application Ser. No. 13/028,059, filed on Feb. 15, 2011, which is incorporated herein by reference in its entirety.

STATEMENT REGARDING FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a back contact, back junction (BCBJ) solar cell, the P-type and N-type diffusion regions and the metal contacts coupled to them are on the backside of the solar cell. The metal contacts allow an external electrical circuit to be coupled to and be powered by the solar cell.

In high-efficiency solar cells, cell parameters, such as shunt resistance, series resistance, and bulk lifetime are important parameters to maintain on the final fabricated devices. Solar cell process steps, in particular laser ablation steps on BCBJ solar cells, may impact each of these parameters. Post laser losses due to series resistance or lifetime maybe be offset at the expense of step cost, such as by adding thermal or etching steps. As is described within, an added complication of shunting on high-efficiency BCBJ solar cells may be prevalent when the cell architecture has metal of one polarity over diffusions of another polarity.

To compete with other energy sources available on the market, solar cells not only have to be efficient but also fabricated at relatively low cost and high yield. Embodiments of the present invention pertain to novel solar cell fabrication processes and structures that reduce the cost of solar cell fabrication and improve solar cell reliability.

BRIEF SUMMARY

In one embodiment, contact holes of solar cells are formed by laser ablation to accommodate various solar cell designs. Use of a laser to form the contact holes is facilitated by replacing films formed on the diffusion regions with a film that has substantially uniform thickness. The film thickness as absorption may be tailored to match laser parameters. Dopant depth underneath contact holes may be controlled to increase the laser ablation process margins. The laser configuration may be tailored to form contact holes through dielectric films of varying thicknesses.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter disclosed herein may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of apparatus, processes, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In some high-efficiency solar cell designs, metal contacts for one polarity of diffusion region may run over an opposite polarity diffusion region (e.g., metal contact for an N-type diffusion region formed over a P-type diffusion region). In that solar cell design, it is critical that the interlayer dielectric that electrically insulates the metal contacts from the diffusion regions is free of defects. Otherwise, a metal contact of one polarity may electrically short to a diffusion region of opposite polarity through a defect in the interlayer dielectric.

Figure 1:
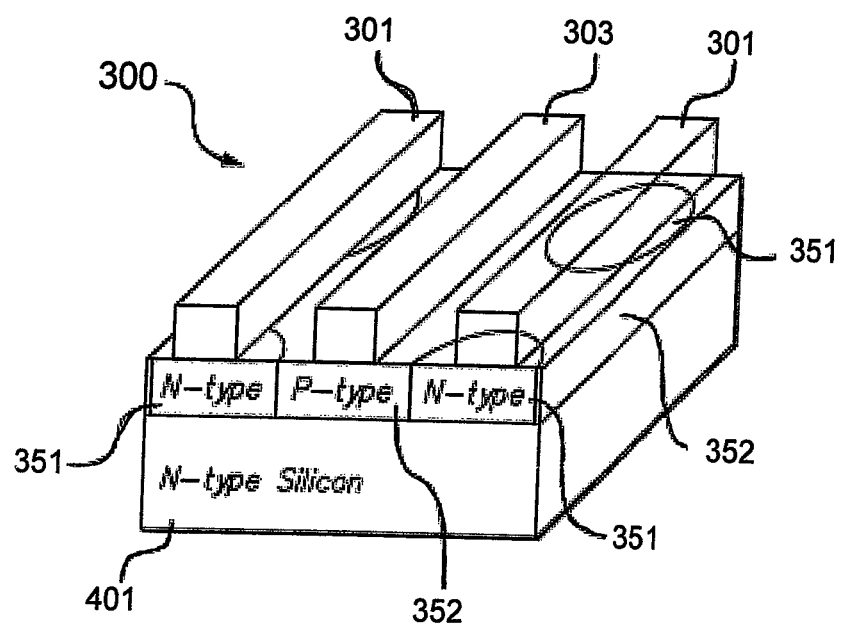
FIG. 1 schematically shows an example BCBJ solar cell with metal contacts that are formed over opposite polarity diffusion regions.

FIG. 1 schematically shows an example backside contact, backside junction (BCBJ) solar cell 300 with metal contacts that are formed over opposite polarity diffusion regions. In the example of FIG. 1, the P-type (labeled 352) and N-type (labeled 351) diffusion regions are formed in a substrate 401 (e.g., mono-crystalline or multi-crystalline silicon). In other embodiments, the P-type and N-type diffusion regions are formed in another layer, e.g., polysilicon, on a backside surface of the substrate of 401. Interlayer dielectrics are not shown in FIG. 1 for clarity of illustration.

The solar cell 300 includes metal contacts 301 and 303. Metal contacts 301 are N-polarity metal contacts in that they electrically couple to corresponding N-type diffusion regions. Similarly, metal contacts 303 (only one is shown in FIG. 1) are P-polarity metal contacts that electrically couple to corresponding P-type diffusion regions. The metal contacts 301 and 303 may be interdigitated. One metal contact 301 is depicted in FIG. 1 as a transparent line tracing to more clearly show underlying N-type diffusion regions. As shown in FIG. 1, an N-polarity metal contact 301 passes over portions of a P-type diffusion region. This creates the possibility of the N-polarity metal contact 301 being electrically shorted to the P-type diffusion region through an intervening interlayer dielectric (not shown in FIG. 1; see 305 in FIGS. 3 and 8).

Figure 2:
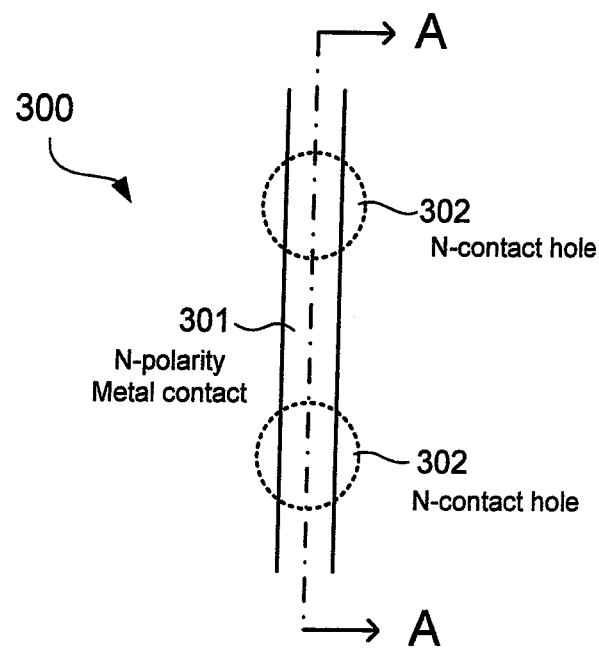
FIG. 2 shows a top view of the solar cell of FIG. 1.

FIG. 2 shows a top view of a portion of the solar cell 300. The solar cell 300 includes contact holes 302 that are formed through an interlayer dielectric separating the N-polarity metal contact 301 from underlying diffusion regions. The N-polarity metal contact 301 contacts underlying N-type diffusion regions through corresponding contact holes 302.

Figure 3:
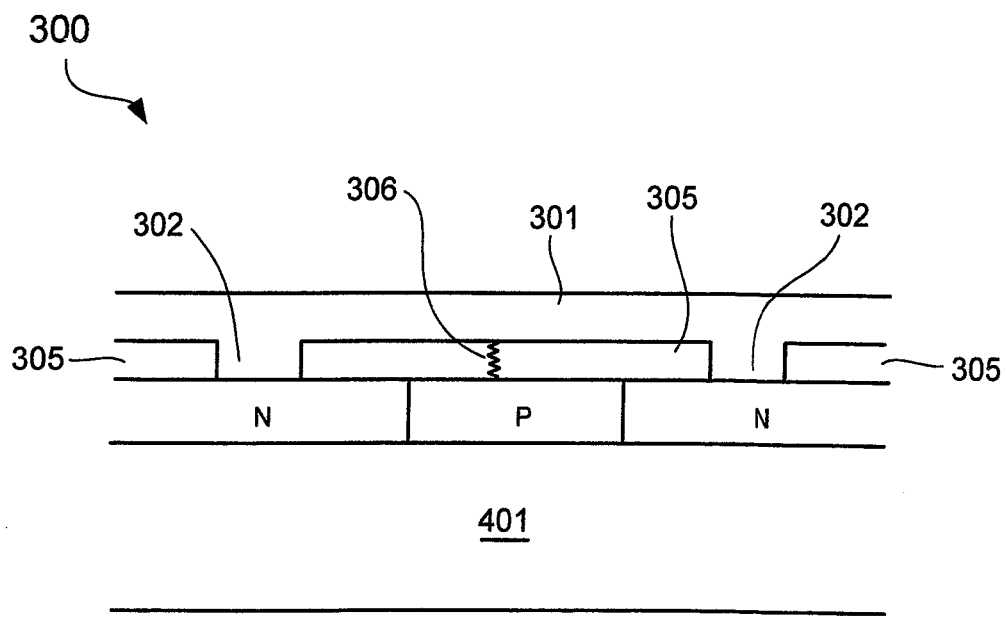
FIG. 3 shows a cross-section of the solar cell of FIG. 1 taken at section A-A of FIG. 2.

FIG. 3 shows a cross-section of the solar cell 300 taken at section A-A of FIG. 2. As shown in FIG. 3, the solar cell 300 includes an interlayer dielectric 305, which electrically insulates the N-polarity metal contact 301 from underlying diffusion regions. Contact holes 302 are formed through the interlayer dielectric 305 to allow the N-polarity metal contact 301 to electrically connect to corresponding N-type diffusion regions. The contact holes 302 are typically formed by conventional masking and wet etching. The inventors discovered that some etchants used in the etch process may worsen existing imperfections (e.g., pinholes, pits, and other defects) in the interlayer dielectric 305, turning the imperfections into full-blown defects. For example, some etchants may enlarge existing pinholes. As another example, some etchants may result in creation of an electrical short 306 through the interlayer dialect 305.

Using a laser, rather than a conventional wet etch process, to form the contact holes 302 advantageously avoids worsening imperfections that may be present in the interlayer dielectric 305. By avoiding exposure of the interlayer dielectric 305 to harmful etchants during contact hole formation, a laser ablation step preserves the integrity of the interlayer dielectric 305.

Figure 4:
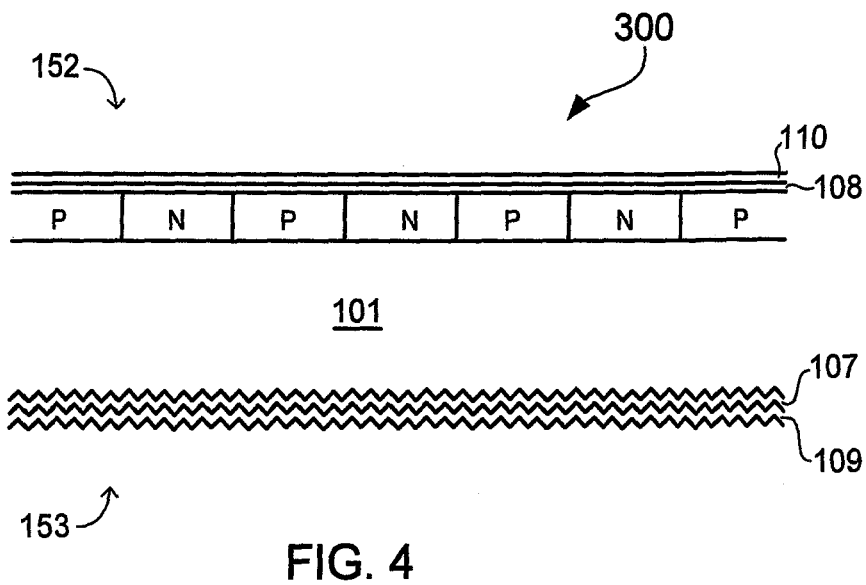
FIGS. 4-6 show cross-sections of a solar cell being fabricated in accordance with an embodiment of the present invention.

FIG. 4 shows a cross-section of a solar cell 300 being fabricated in accordance with an embodiment of the present invention. The solar cell 300 has a front side 153 and a backside 152. The front side 153 faces the sun to collect solar radiation during normal operation. The backside 152 is opposite the front side 153.

In the example of FIG. 4, the substrate 101 comprises an N-type monocrystalline silicon wafer. The P-type and N-type diffusion regions are formed in the solar cell substrate 101, but may also be in another layer (e.g., polysilicon) formed on the solar cell substrate 101. The front side surface of the substrate 101 is textured with random pyramids to increase solar radiation collection efficiency. A passivation region 107 passivates the front side surface of the substrate 101 to minimize recombination. In one embodiment, the passivation region 107 is an N-type passivation region formed by diffusing N-type dopants from the front side 153. The N-type dopants may comprise phosphorus. In one embodiment, the passivation region 107 is formed by heating the substrate 101 in a furnace where phosphorus is introduced. The phosphorus diffuses into the front side of the substrate 101 to form the passivation region 107. A silicon dioxide layer 108 on the back side 152 of the solar cell is a byproduct of forming the passivation region 107. More specifically, the heating step to diffuse N-type dopants into the substrate 101 and form the passivation region 107 also results in growth of the oxide layer 108 on the backside surface of the substrate 101.

An anti-reflective coating 109 is formed on the front side 153 and an anti-reflective coating 110 is formed on the backside 152. In one embodiment, the anti-reflective coatings 109 and 110 comprise silicon nitride. On the front side 153, the anti-reflective coating 109 is formed on the passivation region 107 on the front side surface of the substrate 101. On the backside 152, the anti-reflective coating 110 is formed on the oxide layer 108.

Figure 5:
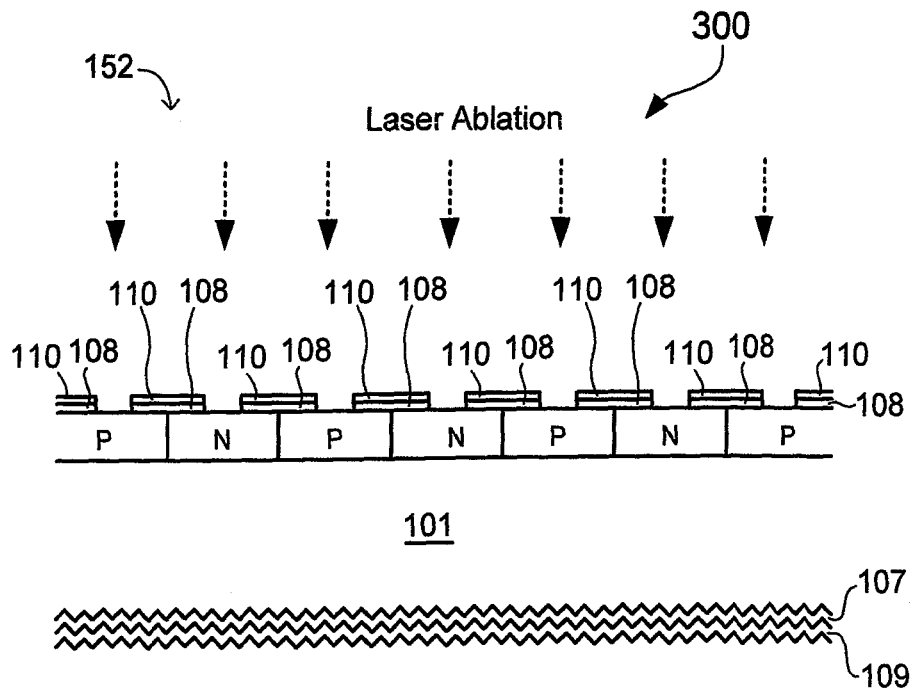

In FIG. 5, a laser ablation step is performed on the solar cell 300 to form contact holes to the P-type and N-type diffusion regions. The laser ablation step may involve firing one or more laser beams to remove materials from the backside 152 and thereby expose the P-type and N-type diffusion regions for metallization. In the example of FIG. 5, the laser ablation step removes portions of the anti-reflective coating 110 and oxide layer 108 to form contact holes to the P-type and N-type diffusion regions. The laser ablation step may be performed by firing laser beams through a laser scanner, which scans the laser beams on the backside 152 to form the contact holes. A commercially available laser source and scanner may be employed to perform the laser ablation. An example solar cell ablation system that employs a laser is disclosed in commonly-owned U.S. application Ser. No. 12/829,275, filed on Jul. 1, 2010. Other ablation systems that employ a laser may also be employed.

The use of a laser to form the contact holes to the P-type and N-type diffusion regions advantageously eliminates masking and curing steps that may be necessary in other processes where the contact holes are formed by a traditional etch process. In addition, laser ablation prevents exposure of the anti-reflective coating 110 and oxide layer 108, and any interlayer dielectric that may be present, to etchants that may worsen existing defects or imperfections.

Figure 6:
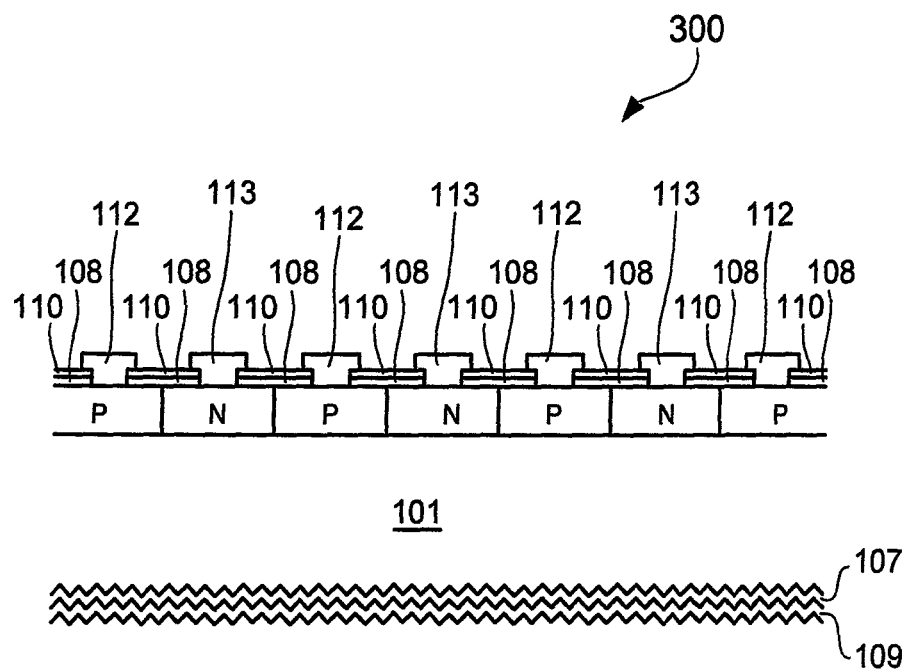

In FIG. 6, metal contacts 112 and 113 are formed in the contact holes to make electrical connection to corresponding diffusion regions. In the example of FIG. 6, the metal contacts 112 are formed in contact holes to make electrical connection to the P-type diffusion regions. Similarly, the metal contacts 113 are formed in contact holes to make electrical connection to the N-type diffusion regions. The metal contacts 112 and 113 may be interdigitated, and may comprise copper or other single layer or multi-layer electrically conductive materials employed for metallization. The metal contacts 112 and 113 may be formed by electro-plating, for example. The metal contacts 112 and 113 allow an electrical circuit to be coupled to and be powered by the solar cell. A metal contact 112 to a P-type diffusion region may pass over an N-type diffusion region. Similarly, a metal contact 113 to an N-type diffusion region may pass over a P-type diffusion region. Because the metal contacts are formed in contact holes formed by laser ablation, the chances of a metal contact electrically shorting to an opposite polarity diffusion region is greatly diminished.

Figure 7:
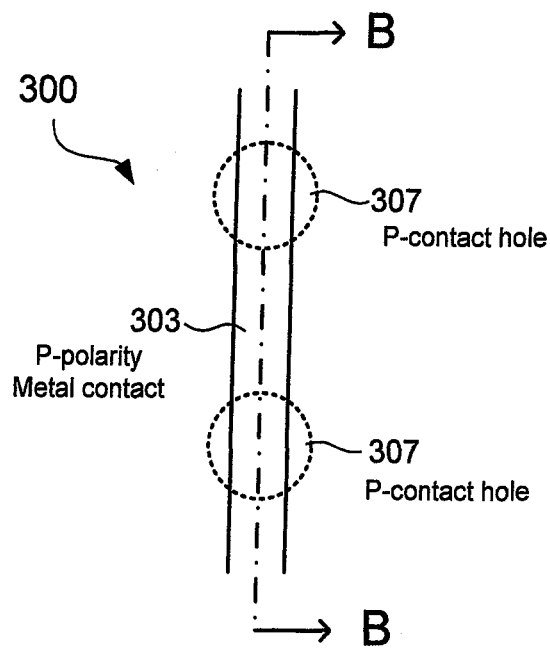
FIG. 7 shows another top view of the solar cell of FIG. 1.

A potential laser-related problem discovered by the inventors is now described with reference to FIGS. 7 and 8. FIG. 7 shows another top view of a portion of the solar cell 300 of FIG. 1. The solar cell 300 includes contact holes 307 that are formed through an interlayer dielectric separating the P-polarity metal contact 303 from underlying diffusion regions.

Figure 8:
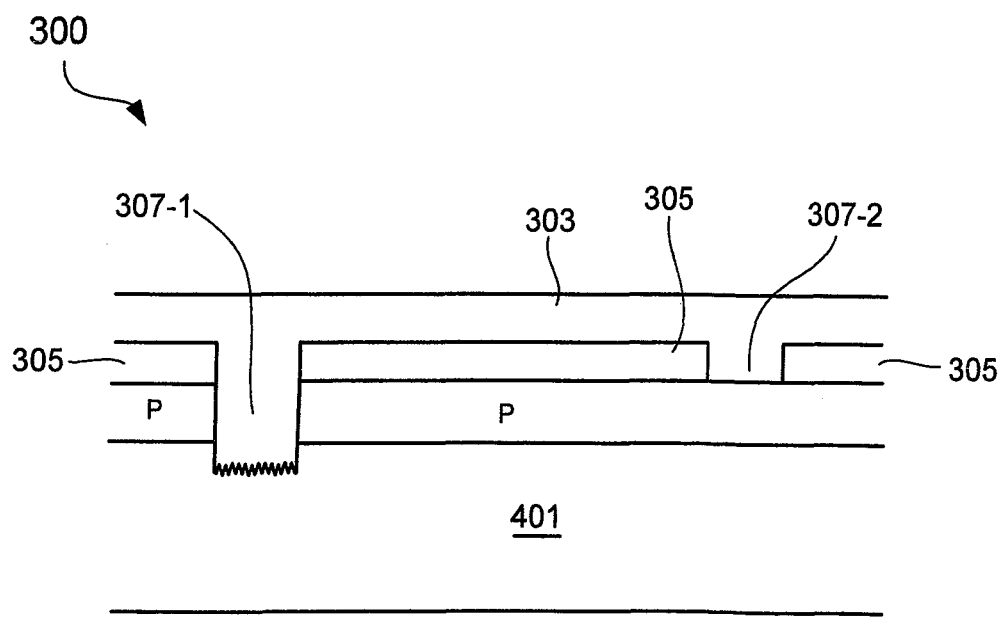
FIG. 8 shows a cross-section of the solar cell of FIG. 1 taken at section B-B of FIG. 7.

FIG. 8 shows a cross-section of the solar cell 300 taken at section B-B of FIG. 7. Contact holes 307 (i.e., 307-1, 307-2, . . . ) are formed through the interlayer dielectric 305 to allow the P-polarity metal contact 303 to electrically connect to the underlying P-type diffusion region.

In the example of FIG. 8, the contact holes 307 are formed by laser ablation. If the laser is not properly controlled, the laser beam may punch through the diffusion region, thereby adversely affecting the operation of the solar cell by electrically shorting the subsequently formed metal contact to the substrate. In the example of FIG. 8, the laser ablation step formed the contact hole 307-1 all the way through the interlayer dielectric 305, all the way through the P-type diffusion region, and into the substrate 401. One way of addressing this laser punch through problem is to make the diffusion regions deeper, as now explained with reference to FIG. 9.

Figure 9:
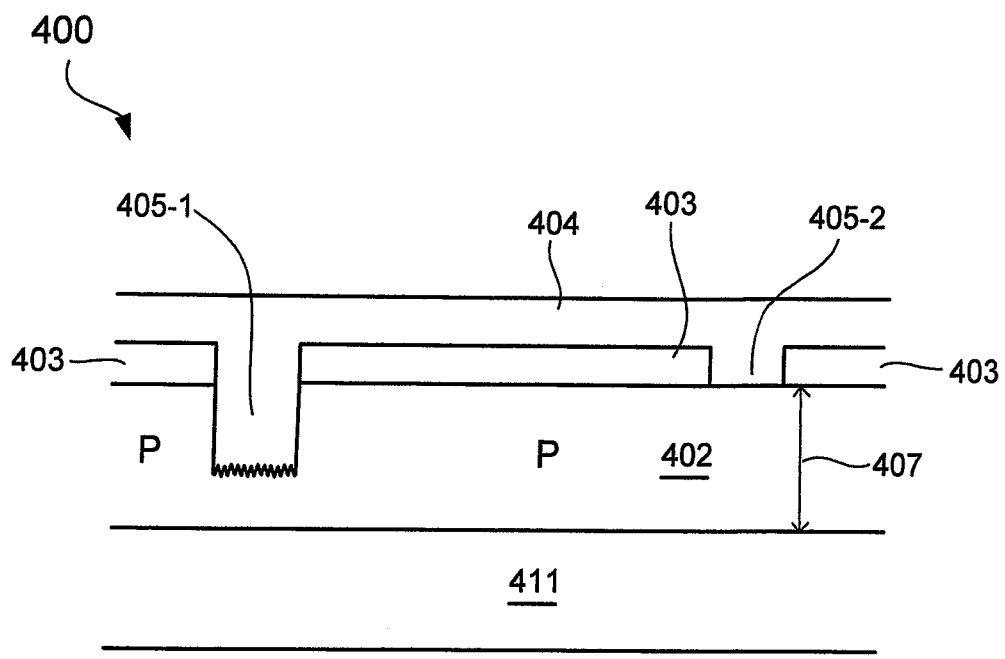
FIG. 9 shows a cross-section of a solar cell with deep diffusion regions in accordance with an embodiment of the present invention.

FIG. 9 shows a cross-section of a solar cell 400 with deep diffusions in accordance with an embodiment of the present invention. In the example of FIG. 9, a P-type diffusion region (labeled as 402) is formed in a solar cell substrate 411, which comprises a monocrystalline silicon wafer. In other embodiments, the P-type diffusion region is formed in another layer (e.g., polysilicon) formed on the backside surface of the substrate 411. In the example of FIG. 9, contact holes 405 (i.e., 405-1, 405-2, ...) are formed through an interlayer dielectric 403 by laser ablation. A P-polarity metal contact 404 electrically connects to the P-type diffusion region through the contact holes 405. It is to be noted that all figures in this disclosure, including FIG. 9, are not drawn to scale.

In the example of FIG. 9, the P-type diffusion region is formed to be relatively deep. For example, the P-type diffusion region may have a depth 407 deeper than 0.5 μm. The depth of the P-type diffusion region is dictated by the process margins of the laser ablation step. Preferably, the required laser ablation depth is minimized for the process, and then measured on a cross-section. The dopant depth of the diffusion region is then set deeper than the required laser ablation depth by controlling the dopant formation process (e.g., furnace temperature and time, starting dopant concentration, etc). Deep diffusion regions advantageously allow for a laser ablation step with wider process margins. Deep N-type diffusion regions formed on the backside of the solar cell with the P-type diffusions region may also have the same depth as the P-type diffusion regions.

In the example of FIG. 9, the contact hole 405-1 is formed relatively deep into the P-type diffusion region. The deep contact hole 405-1 may be due to problems related to process control in general, laser ablation process margin, or other issues. However, unlike in FIG. 8, the contact hole 405-1 does not punch all the way through the P-type diffusion region because of the depth of the P-type diffusion region. The metal contact 404 is formed in the contact holes 405 (i.e., 405-1, 405-2, ...). The metal contact 404 may safely pass over a diffusion region of opposite polarity (i.e., N-type diffusion region) because the metal contact 404 is formed in contact holes formed by laser ablation.

The inventors also discovered that different film thicknesses found in some solar cell designs may complicate laser ablation. An example of such solar cell design is shown in FIG. 10.

Figure 10:
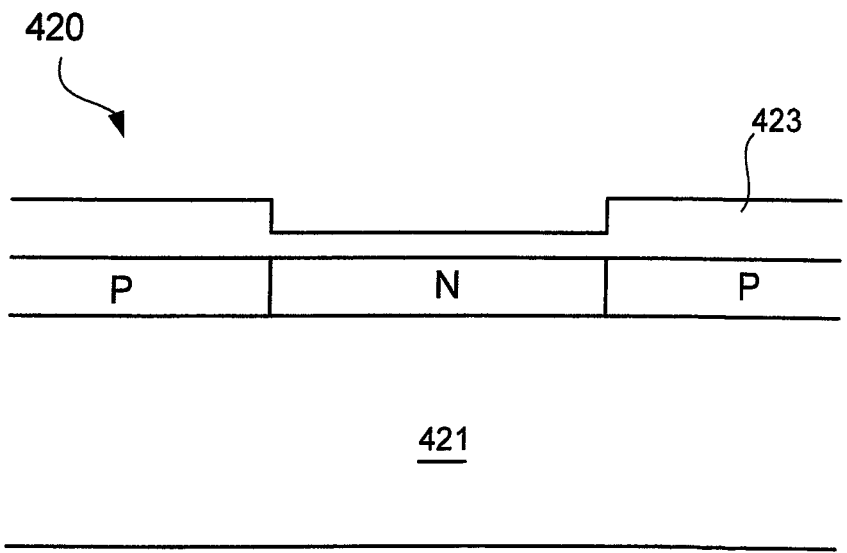
FIGS. 10-13 show cross-sections of a solar cell being fabricated in accordance with another embodiment of the present invention.

FIG. 10 shows a cross-section of a solar cell 420 having a non-uniform film 423 through which contact holes are to be formed. In the example of FIG. 10, the film 423 comprises an interlayer dielectric. The film 423 may be a single layer dielectric or a multi-layer dielectric stack (e.g., oxides and/or nitrides; oxides and/or polyimide) formed over a solar cell substrate 421. The solar cell substrate 421 may comprise a monocrystalline silicon wafer. The P-type and N-type diffusion regions may be formed in the solar cell substrate 421 or in another layer (e.g., polysilicon) formed on the solar cell substrate 421.

In the example of FIG. 10, portions of the film 423 over the P-type diffusion regions are thicker than portions of the film 423 over the N-type diffusion regions. In other cases, portions of the film 423 over the N-type diffusion regions are thicker than portions of the film 423 over the P-type diffusion regions. This difference in film thicknesses may be due to the process of forming the P-type and N-type diffusion regions, such as in the sequence of forming dopant sources over the diffusion regions. Forming contact holes through the film 423 to the N-type diffusion regions requires less laser energy compared to forming contact holes through the film 423 to the P-type diffusion regions. Using the same laser energy to form contact holes to the P-type and N-type diffusion regions may thus result in punching through the P-type diffusion regions, or other problems. On the other hand, using different laser energies to form contact holes to the P-type and N-type diffusion regions may require multiple laser ablation steps and may result in processing delays not just because of the additional steps, but also in reconfiguring the laser for different energies.

For the solar cell design of FIG. 10, the thickness of the dielectric stack over the P-type diffusion regions may be in the 500-10000 Angstroms range, and the diffusion depth of the P-type diffusion regions may be in the 200-2000 nm range. For a high-efficiency solar cell, i.e., a solar cell with efficiency greater than 20%, the standard bulk recombination rate (BRR) and saturation current density (Jo) would be less than 1000 Hz and 120 fA/cm$^2$ if there were no laser damage. To avoid ablation all the way through the junction in the base and increase the BRR and Jo, while also completely removing the film being ablated, the proper laser condition must be used. Using a wavelength shorter than 540 nm while keeping the absorption depth to a minimum prevents the BRR from increasing higher than 1000 Hz. Using a laser with a pulse length shorter than 20 ps will keep the thermal ablation depth to less than 2000 nm. The laser energy would then be tuned so that the ablation threshold is achieved (e.g., 1-20 μJ). Complete oxide removal would then result in series resistance of less than 1 ohm-cm$^2$ in the finished solar cell. However, with these film stack thickness conditions on a high-efficiency solar cell, a single laser pulse will still not be able to clear an entire dielectric stack without increasing the BRR and Jo. That is, keeping the BRR to less than 1000 Hz and Jo to less than 120 fA/cm$^2$ will result in series resistance greater than 1 ohm-cm$^2$, and getting the series resistance less than 1 ohm-cm$^2$ will result in the BRR increasing higher than 1000 Hz. This problem may be solved by using 2 or more laser pulses, where the pulse to pulse spacing is separated by less than 500 ns and the amplitude of the subsequent pulses is between 10% and 100% the amplitude of the first pulse. This allows for more material removal without additional increase in BRR and Jo. An example multi-pulse laser ablation process is described in commonly-owned U.S. application Ser. No. 12/795,526, filed on Jun. 7, 2010, and incorporated herein by reference in its entirety. Other multi-pulse laser ablation processes may also be used.

Because the dielectric stack thicknesses over the P-type and N-type diffusion regions may be different, and thus require different laser energies to achieve the proper BRR/series resistance balance, the laser ablation tool gets relatively complicated, requiring changes in power for different regions of the solar cell being fabricated. This requires precise spatial coordination between the laser and the beam delivery system to synchronize laser power and location and avoid creating shunts (i.e., electrical shorts) due to a misaligned laser. Misalignment can be avoided by slowing down the beam delivery system. However, doing so would result in lower throughput on the tool, and therefore increase the tool cost for a certain throughput. As a solution, the dielectric stack may be tuned so that the ideal laser parameter, such as energy and number of pulses, on one region does not result in ablation in another region. For example, dielectric stack thickness over the P-type diffusion regions may be made to be 5000-10000 Angstroms, and the dielectric stack thickness over the N-type diffusion regions may be made to be less than 2500 Angstroms. This allows a laser energy of 3 µJ with two pulses to ablate the dielectric stack over the N-type diffusion regions, but not the dielectric stack over the P-type diffusion regions.

Figure 15:
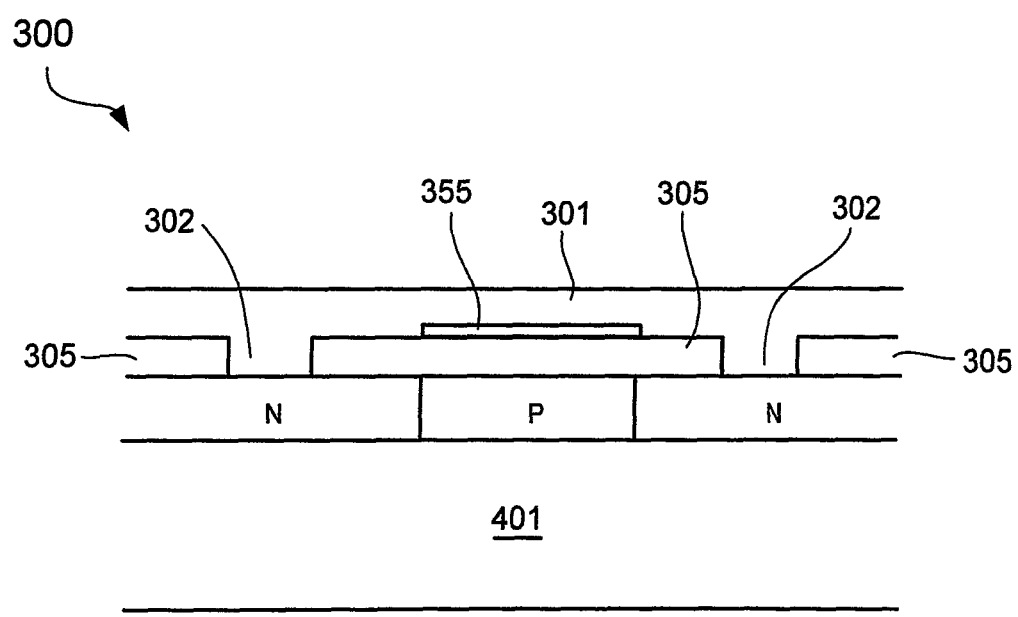
FIG. 15 shows the cross-section of FIG. 3 with an additional dielectric layer in accordance with an embodiment of the present invention.

In any case where laser misalignment may cause a shunt problem as described above (e.g., in FIG. 3, the electrical short 306), the inventors have discovered that an additional dielectric layer may be deposited in a patterned way so that the laser is blocked from causing ablation. FIG. 15 shows the cross-section of FIG. 3 except for the addition of an additional dielectric layer 355 patterned on portions of the interlayer dielectric layer 305 over the P-type diffusion regions. Other components shown in FIG. 15 have been discussed with reference to FIG. 3.

In the example of FIG. 15, the additional dielectric layer 355 may comprise a material that may be ablated sacrificially, such as a pigmented ink. The additional dielectric layer 355 may be thick enough (e.g., greater than 500 Angstroms) to prevent absorption of the laser wavelength used. The additional dielectric layer 355 may also comprise a material that is transparent to the laser (e.g., polyimide) but thick enough (e.g., greater than 500 Angstroms) to prevent the ablated material underneath from breaking through. The additional dielectric layer 355 may also comprise a semi-transparent material, provided that the combination of direct ablation of the sacrificial layer and ejected material from below does not cause a pinhole to form in the additional dielectric layer 355. It should be noted that this additional dielectric layer 355 may also have properties that prevent dielectric breakdown, as discussed later below.

Figure 11:
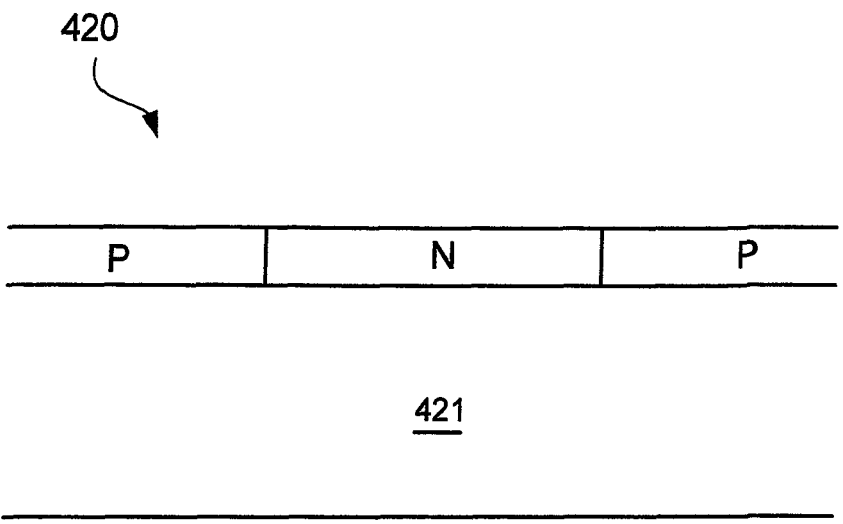
Figure 12:
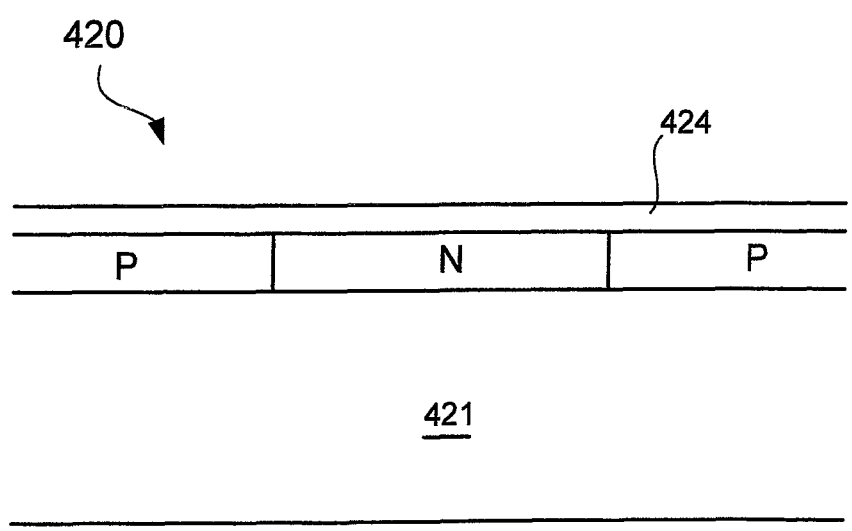
Figure 13:
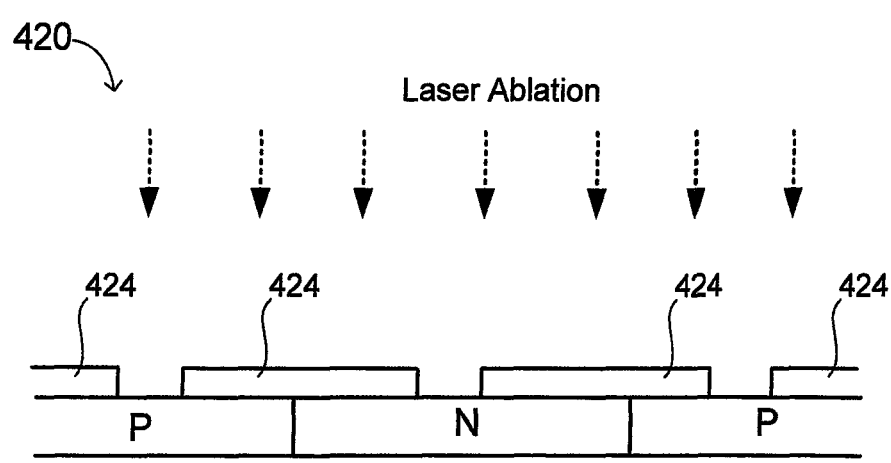

In accordance with an embodiment of the present invention, the solar cell 420 of FIG. 10 is prepared for laser ablation by removing the film 423 and any other material previously formed on the P-type and N-type diffusion regions. This approach is especially advantageous in cases where the dielectric stacks vary from each other by more than 200 Angstroms. This approach is further illustrated in FIG. 11 where all materials on the P-type and N-type diffusion regions have been removed to expose the backside surface of the P-type and N-type diffusion regions. For example, the film 423 of FIG. 10 may be removed using a conventional wet etch process. The film 423 and any other material on the P-type and N-type diffusion regions are removed to control the thickness of the film subsequently formed on the P-type and N-type diffusion regions. Accordingly, in the example of FIG. 12, a substantially uniform film 424 is formed on the P-type and N-type diffusion regions. In essence, the film 424 replaces the non-uniform film 423. The film 424 may comprise an interlayer dielectric (e.g., deposited or thermally grown oxide, followed by silicon nitride) that is deposited with substantially uniform thickness. The film 424 may be deposited by chemical vapor deposition, other deposition, or growth process that allows for uniform film deposition. In FIG. 13, the replacement of the non-uniform film 423 with the uniform film 424 is subsequently followed by a laser ablation step to form contact holes through the film 424 to expose portions of the P-type and N-type diffusion regions. The contact holes allow metal contacts to electrically connect to corresponding diffusion regions. A metal contact to a P-type diffusion region may pass over an N-type diffusion region. Similarly, a metal contact to an N-type diffusion region may pass over a P-type diffusion region. Because the metal contacts are formed in contact holes formed by laser ablation, the chances of a metal contact electrically shorting to an opposite polarity diffusion region is greatly diminished.

Contact holes through the film 423 of FIG. 10 may also be formed by appropriate control of the laser used in the laser ablation step. Typical ablation of dielectric films is through the process of indirect ablation, where the laser energy is absorbed in the substrate, and the film is ejected via the outward force of the ablated substrate. This type of film ablation is known as indirect ablation. For example, when the film of interest does not interact strongly with the laser wavelength, ablation depth and damage in the substrate are driven primarily by pulse length, wavelength, and number of pulses of the laser, all of which need to be reduced for minimal substrate ablation depth. If the film or one of the films in a film stack of interest interacts strongly with the laser wavelength, the laser process parameters will need to be adjusted accordingly, for example, by increasing the number of pulses or by switching the laser wavelength so that direct ablation occurs. Certain types of films may be removed via direct ablation, without ablation in the silicon, by using multiple pulses. An example laser ablation process using multiple laser pulses is described in commonly-owned U.S. application Ser. No. 12/795,526, filed on Jun. 7, 2010, and incorporated herein by reference in its entirety. Other multi-pulse laser ablation processes may also be used without detracting from the merits of the present invention.

A method to modify the optical properties of a dielectric layer (e.g., P-type or N-type doped silicon dioxide) or dielectric stack to suit laser ablation parameters may include tuning refractive index and absorption coefficients of the dielectric through compositional control, or by adding absorbing compounds to the dielectric layer to tune the dielectric layer to get either direct or indirect ablation. As a particular example, refractive indices less than 2.0 for laser wavelengths of 530 nm or longer cause indirect ablation to occur and prevent residual material from remaining on the substrate.

As applied to FIG. 10, a first laser ablation step may be performed to form contact holes through portions of the film 423 over the P-type diffusion regions. The first laser ablation step may be in accordance with a first laser configuration having parameters tailored specifically for the characteristics of the portions of the film 423 over the P-type diffusion regions. A second laser ablation step may be performed to form contact holes through portions of the film 423 over the N-type diffusion regions. The second laser ablation step may be in accordance with a second laser configuration having parameters tailored specifically for the characteristics of the portions of the film 423 over the N-type diffusion regions. The first configuration being different from the second configuration. For example, the first configuration may involve the laser firing multiple laser pulses to drill through portions of the film 423 over the P-type diffusion regions. As another example, the second configuration may involve the laser firing a single laser pulse to drill through portions of the film 423 over the N-type diffusion regions.

Figure 14:
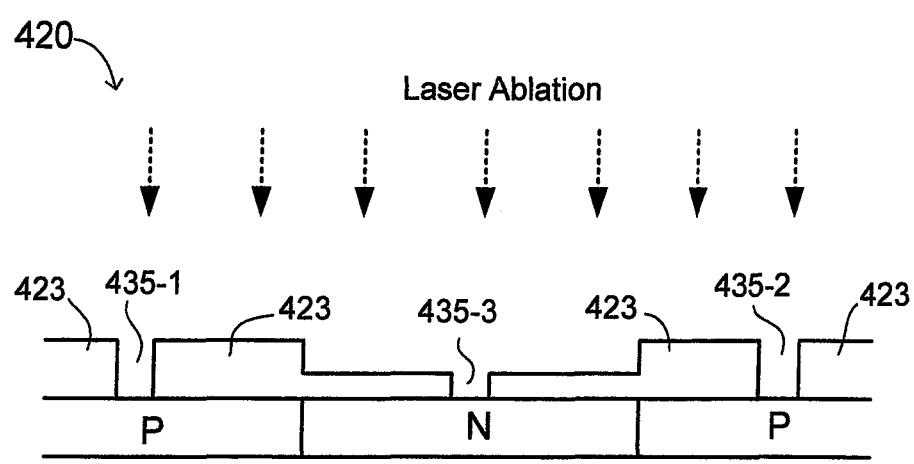
FIG. 14 shows a cross-section of a solar cell with laser-formed contact holes in accordance with another embodiment of the present invention.

The resulting structure is schematically shown in FIG. 14, where the contact holes 435-1 and 435-2 through the film 423 and exposing the P-type diffusion regions are formed by laser ablation with the laser firing in accordance with the first configuration, and the contact hole 435-3 through the film 423 and exposing an N-type diffusion region is formed by laser ablation with the laser firing in accordance with the second configuration. Metal contacts may be formed in the contact holes 435 (i.e., 435-1, 435-2, 435-3). A metal contact may be safely formed over a diffusion region of opposite polarity (e.g., N-polarity metal contact over a P-type diffusion region) because the metal contacts are in contact holes formed by laser ablation.

In another embodiment, where defects in an interlayer dielectric, such as the one described with reference to FIG. 3, may be present, the anti-reflective coating deposited on the backside (e.g., anti-reflective coating 110 of FIGS. 4-6) may be tailored in a way to improve the dielectric integrity of the back stack. For example, the thickness and/or resistivity of the backside anti-reflective coating may be increased by approximately 50-100 Angstroms. As another example, the anti-reflective coating may comprise two layers, such as a layer of amorphous-silicon that is uniformly deposited on top or underneath a silicon nitride layer. Preferably, to save fabrication cost, the layer of amorphous silicon and the silicon nitride layer are formed in-situ (i.e., same loading) in the same process step in the same tool. The use of a two layer anti-reflective coating as described herein advantageously increases not just the thickness of the anti-reflective coating but also its dielectric constant, thereby facilitating laser ablation.

In reverse bias, for example, upwards of 6 volts may be applied across the interlayer dielectric film. Typical plasma-enhanced chemical vapor deposition (PECVD) nitride films having a thickness in the range of about 400 Angstroms would breakdown at this voltage if the voltage were applied locally. A target breakdown field of the dielectric film for such an application can be greater than $1 \times 10^7$ V/cm. The target breakdown field may be achieved by addition of 50-100 Angstrom layer of amorphous silicon to the silicon nitride layer, which could decrease the effective field applied within the stack.

Improved processes and structures for fabricating solar cells have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A process of fabricating a solar cell, the process comprising:

forming an anti-reflective coating over an interlayer dielectric on a backside of a solar cell, the anti-reflective coating together with the interlayer dielectric being configured to have a breakdown voltage that is greater than $1 \times 10^7$ V/cm;

using a laser to form a contact hole through the interlayer dielectric and the anti-reflective coating to expose an underlying diffusion region of the solar cell; and forming a metal contact in the contact hole to electrically connect to the diffusion region, wherein the anti-reflective coating comprises a layer of amorphous silicon and a layer of silicon nitride.

2. The process of claim 1 wherein the breakdown voltage is configured by decreasing a refractive index of the interlayer dielectric to less than 1.95.

3. A solar cell fabricated using the process of claim 1.

4. A process of fabricating a solar cell, the process comprising:

forming a multi-layer anti-reflective coating (ARC) over an interlayer dielectric on a backside of a solar cell, the multi-layer ARC comprising a first ARC layer and a second ARC layer, the multi-layer ARC and the interlayer dielectric layer being configured to have a breakdown voltage that is greater than $1 \times 10^7$ V/cm;

using a laser to form a contact hole through the interlayer dielectric, the first ARC layer, and the second ARC layer to expose an underlying diffusion region of the solar cell; and forming a metal contact in the contact hole to electrically connect to the diffusion region, wherein the first ARC layer comprises silicon nitride that is formed over the second ARC layer that comprises amorphous silicon.

5. The process of claim 4, wherein the first ARC layer and the second ARC layer are formed in-situ.

6. The process of claim 4, wherein the multi-layer ARC is formed over a plurality of N-type diffusion regions and a plurality of P-type diffusion regions on the backside of the solar cell.

7. The process of claim 4, wherein the breakdown voltage is configured by decreasing a refractive index of the interlayer dielectric to less than 1.95.

* * * * *